United States Patent [19]

Isobe et al.

[11] Patent Number: 4,524,389
[45] Date of Patent: Jun. 18, 1985

[54] SYNCHRONOUS VIDEO DETECTOR CIRCUIT USING PHASE-LOCKED LOOP

[75] Inventors: Mitsuo Isobe, Kadoma; Tetsuo Kutsuki, Toyonaka; Namio Yamaguchi, Hirakata; Toshihide Tanaka, Ikoma, all of Japan

[73] Assignee: Matsushita Electric Industrial Co., Ltd., Osaka, Japan

[21] Appl. No.: 438,466

[22] Filed: Nov. 2, 1982

[30] Foreign Application Priority Data

Nov. 9, 1981 [JP] Japan .................................. 56-179469
Nov. 17, 1981 [JP] Japan .................................. 56-184617

[51] Int. Cl.$^3$ .......................... H04N 5/44; H04B 1/68
[52] U.S. Cl. .................................. 358/188; 358/167; 358/197; 455/202
[58] Field of Search ............... 358/188, 197, 167; 455/208, 255, 257, 260, 265, 122, 202

[56] References Cited

U.S. PATENT DOCUMENTS 4,336,616  6/1982  Carson et al. ................... 455/208

Primary Examiner—Tommy P. Chin
Assistant Examiner—Victor R. Kostak
Attorney, Agent, or Firm—Stevens, Davis, Miller & Mosher

[57] ABSTRACT

In a synchronous video detector circuit using a phase-locked loop, the synchronous detection of a video IF signal is effected with a synchronous carrier signal reproduced by the PLL including a voltage-controlled oscillator. Each of a phase comparator of the PLL and a synchronous video detector has its input terminal connected to an output terminal of a video IF amplifier by untuned coupling, and arranged on the output side of the synchronous video detector is a phase-locked mode detector for detecting that the PLL is in its phase-locked mode. The phase-locked mode detector is adapted to control the band width of a low-pass filter of the PLL in either a narrow band mode or a wide band mode and the low-pass filter is controlled to operate in the narrow band mode only when the PLL is in the phase-locked mode of operation. The black and white noise included in the output signal of the synchronous video detector are both cancelled by a noise cancellation circuit including a black noise detector for pulse noise cancellation purposes.

15 Claims, 6 Drawing Figures $E_0$: ZERO CARRIER LEVEL $E_0$: ZERO CARRIER LEVEL $E_1$
$E_2$

SYNCHRONOUS VIDEO DETECTOR CIRCUIT USING PHASE-LOCKED LOOP

The present invention relates generally to receivers of the type in which an amplitude-modulated signal is received and a modulating signal is reproduced, and more particularly, the invention relates, to a video detector circuit of a television receiver which is coupled to a video IF circuit, in which synchronous detection is performed by means of a synchronous carrier signal reproduced by a phase-locked loop.

In known television receivers of the ordinary type, the construction of RF-IF stages for receiving a modulated television signal and reproducing a video signal includes a tuner for receiving, amplifying and converting an RF signal to a given IF signal frequency, an IF filter and an amplifier for selecting only the desired signal frequency component, a video detector for reproducing a video signal from the IF signal, a video signal processing circuit, etc. In the case of the known envelope detector, or quasi-synchronous detector of the type which performs the product detection by extracting the IF carrier component from an IF signal with a given passive filter, the IF amplifier and the detector are substantially wide-band coupled with each other and thus a video signal can be produced at the detector output terminal over a wide range of frequencies even if the IF frequency differs from the reference frequency. In the case of a genuine synchronous detection, e.g., one in which the product detection is effected by reproducing a synchronous carrier signal through a passive filter of a PLL (phase locked loop) or the like, the lock-in frequency range of the PLL must be increased in order to produce a video signal over a wide range of frequencies irrespective of the IF frequency variations. While this can be attained by increasing the ac gain of the PLL and improving the follow-up characteristic of the PLL to the input signal, there is the effect of deteriorating the video detection characteristic.

For example, where the 4.5-MHz intercarrier sound signal is obtained from the output signal of the video detector, the known buzz distortion is caused in the sound channel and also a waveform distortion is caused in the detected video signal. To ensure both the desired operating stability and improved detection characteristic, a contradiction is encountered from the technical point of view and thus the lock range of the PLL is made as small as on the order of several tens to several hundreds kHz since sacrificing the detection characteristic ruins the usefulness of the synchronous detector.

The known method of increasing the lock range and improving the detection characteristic which are compatible with each other is to change over the pass band of a low-pass filter in a PLL from one bandwidth to another depending on whether the PLL is in the phase-locked mode of operation (synchronous condition) or the non-phase-locked mode of operation (non-synchronous condition) as disclosed, for example, in the Japanese Patent Lay-Open Publication No. 54-150026 (1979). However, the application of this method to the video detector stage of a television receiver involves some problems.

As is well known in the art, the video detector circuit of a television receiver must be economical and highly stable in operation and therefore it is particularly desirable that the circuit is suitable for incorporation in an integrated circuit. It is the usual practice with the integrated circuit to integrate circuits of different functions, e.g., high-gain video IF amplifier and video detector for video detection and an AGC circuit in a single chip from the standpoint of enhancing its economical advantages, and therefore these circuits tend to interfer with one another. In the various arrangements heretofore proposed for synchronous detection with a PLL, a limiter for eliminating the amplitude modulation components of the incoming input signal is placed between a phase comparator of the PLL and the video IF amplifier and this limiter usually includes an LC parallel tuned circuit or tank circuit and two diodes connected back-to-back in parallel with the tuned circuit. It is considered that the limiter is necessary for allowing the PLL to operate satisfactorily. From the standpoint of adaptability to the integrated circuit, however, the LC tuned circuit cannot be incorporated in the same chip with the present integrated circuit techniques as mentioned previously and the interconnection between the LC tuned circuit arranged outside the chip and the circuits inside the chip must be provided by means of the terminals of the integrated circuit package thereby deteriorating the adaptability of the known circuit construction to the integrated circuit. Moreover, the LC tuned circuit of the limiter has the same frequency component as the output signal frequency of the high-gain video IF amplifier and also the input terminal of the video IF amplifier is led to the terminal of the integrated circuit package. Thus, the undesired coupling between these terminals causes deterioration of the operating stability of the video IF amplifier due to, e.g., its abnormal oscillation.

The disadvantage relating to the performance of the television receiver is that the tuned circuit of the limiter causes a phase shift, and when the video IF frequency changes, the amount of the phase shift is also changed. Thus, if the video IF frequency is different from the reference frequency, the detected phase of the synchronous video detector also differs from the reference phase with the resulting deteration of the video detection characteristics.

Next, description will be made of the effects of pulse-like noise in a case where synchronous video detection is applied to a television receiver. It is well known that if pulse-like noise caused by a dryer or the like produces interference in the radio frequency television signal (RF signal), interference or the like is produced in the automatic gain control circuit for adjusting the gain of the video IF amplifier and the scanning circuit and hence in the reproduced picture. The known envelope detector or quasi-synchronous detector reproduces substantially only the black direction components of the noise pulses caused in the negative modulation television signal and thus the degree of interference with the visual image is relatively small. However, in the case of a genuine synchronous detection, that is, a synchronous video detection system using a PLL (hereinafter referred to as a synchronous detection system) in which the phase of the reproduced synchronous carrier is maintained substantially constant, noise pulses which are superposed on the detected video signal differ from those in the case of the known detectors. For instance, in the receiver of negative modulation television signals, noise pulses exceed the prescribed maximum white level, and on the other hand, noise pulses in the black direction are substantially the same as those of the known detectors. Each of the two kinds of noise pulses attains a level which saturates the video amplifier and in particular the noise pulses in the white direction increase in amplitude considerably as mentioned previously. The receiver troubles due to the increased white noise pulses not only enhance the contrast of the noise in the reproduced picture with the resulting increase in the interference with the visual image but also momentarily increase the picture tube beam current considerably thereby giving rise to the known blooming phenomenon. Thus, with the receiver using a synchronous video detector, while the elimination of noise pulses of both in the black and white directions are necessary, the method of eliminating the white noise by means of the same principle as the known noise cancellation circuit responsive to the black noise pulses gives rise to some new problems.

With the television receiver, as is known in the art, it is not desirable for the noise cancellation circuit to respond to thermal noise components produced within the receiver when the incoming input signal is very weak; particularly, if a white noise cancellation action takes place, the picture reproduced in this period of time is held at the gray or black level and undesired black specks are produced making the picture considerably unnatural. When such a phenomenon occurs, the noise in the negative modulation television signal is superposed on the detected video signal and thus in particular a white noise detector tends to respond to the thermal noise close to the white peak. Also, where there is no input signal to the receiver, noise is produced on both sides of the zero carrier level with the resulting greater tendency to exceed the detection levels and in this case the detection level of the white noise detector must have a sufficient allowance so as not to operate erroneously in response to any deviation of the overall gain of the receiver RF-IF stages including the video detector. Thus, there is the disadvantage of greatly decreasing the cancellation effect of the white noise pulses.

A voltage-controlled oscillator circuit of the type disclosed in U.S. Pat. No. 3,963,996 is constructed so that a signal output electrode and a control electrode of a differential amplifier are interconnected so as to effect positive feedback and this circuit construction is balanced thermally thus making it well suited for incorporation in an integrated circuit. However, since the collector electrode of a transistor is connected only to the collector electrode of one of a pair of oscillatory transistors for purposes of dc bias stabilization, there is the disadvantage in that the oscillation levels at the opposite ends of a resonant circuit are unbalanced, and especially, interferences tend to occur among circuits of different functions since the integrated circuit integrates the oscillator circuit with the remaining circuits on the same single chip. There are further disadvantages in that since for the purpose of the dc bias stabilization, the collector electrodes of the oscillatory transistor pair are maintained at the same dc bias through a coil, the provision of the coil between these collector electrodes is absolutely necessary.

It is therefore the object of this invention to provide a video detector circuit using a phase-locked loop (PLL) which is well suited for construction in the form of an integrated circuit and capable of reproducing synchronous carrier signals with a wide lock range and high degree of quality.

The present invention has a feature in that a synchronous video detector and a phase comparator of a phase-locked loop (PLL) for reproducing a synchronous carrier have their signal input terminals connected to the output terminal of a video IF amplifier by a substantially untuned coupling means within an integrated circuit, and a loop filter comprises a variable time constant low-pass filter settable to at least two different time constants thereby controlling the oscillation frequency of a voltage-controlled oscillator by the output signal of the loop filter. The desired time constant of the low-pass filter is selected in accordance with the output signal of a phase-locked mode detector for detecting the phase-locked mode of the phase-locked loop, and the phase-locked mode detector comprises a smoothing filter for providing substantially an average dc level of the output signal from the synchronous video detector and a level detector for comparing the dc signal voltage of the smoothing filter output with a predetermined reference dc voltage.

When the PLL comes into the phase-locked mode of operation, the low-pass filter is changed over to one time constant having a sufficient narrow band characteristic (having preferably a cut-off frequency of less than 20 Hz) which satisfactorily blocks even the vertical scanning frequency (60 Hz) signal component in the video signal and any adverse effect of the vertical scanning frequency component due to the untuned coupling is prevented. On the other hand, until the PLL is operated in the phase-locked mode, the low-pass filter is changed over to the other time constant having a sufficient wider band characteristic and it operates so as to make the locking of the PLL faster.

Furthermore, in the invention, by providing a noise cancellation circuit, pulse-like noise produced in the detected video signal especially whiter or whiter-than-white pulse noise can be removed satisfactorily.

The noise cancellation circuit includes a black noise detector arranged to detect noise pulses which are more black than the synchronous peak value level of the detected video signal, which level is maintained at a given dc level by an automatic gain control circuit, and the output noise pulse of the black noise detector is converted through a pulse-width stretcher into a white noise cancellation signal.

A voltage-controlled oscillator circuit in the PLL is of the type in which at least one of the emitter currents of a pair of oscillatory transistors having their emitter electrodes connected to each other is varied by a variable current source having a voltage-controlled input terminal thereby controlling the oscillation frequency. The voltage-controlled oscillator circuit comprises a single or a plurality of variable voltage source circuits each comprising at least means for detecting a current change of the oscillatory transistor pair caused by the variable current source and converting the current change into a voltage change and a buffer transistor, whereby the output of the variable voltage source circuit is supplied to the collector electrodes of the oscillatory transistors through bias resistors. Thus, the dc bias to the signal output terminals of the oscillator circuit or to the collector electrodes of the oscillatory transistor pair is maintained at a constant value by the variable voltage source circuit arranged in accordance with the invention to achieve the control action of the oscillation frequency by the voltage and at the same time a balanced type oscillation circuit is formed in terms of alternating current. Thus, the output signals respectively generated at the collector electrodes of the oscillatory transistor pair are 180 degrees out of phase with each other and have the same level in amplitude.

The present invention will be apparent from the following detailed description taken in conjunction with the accompanying drawings, in which.

Figure 1:
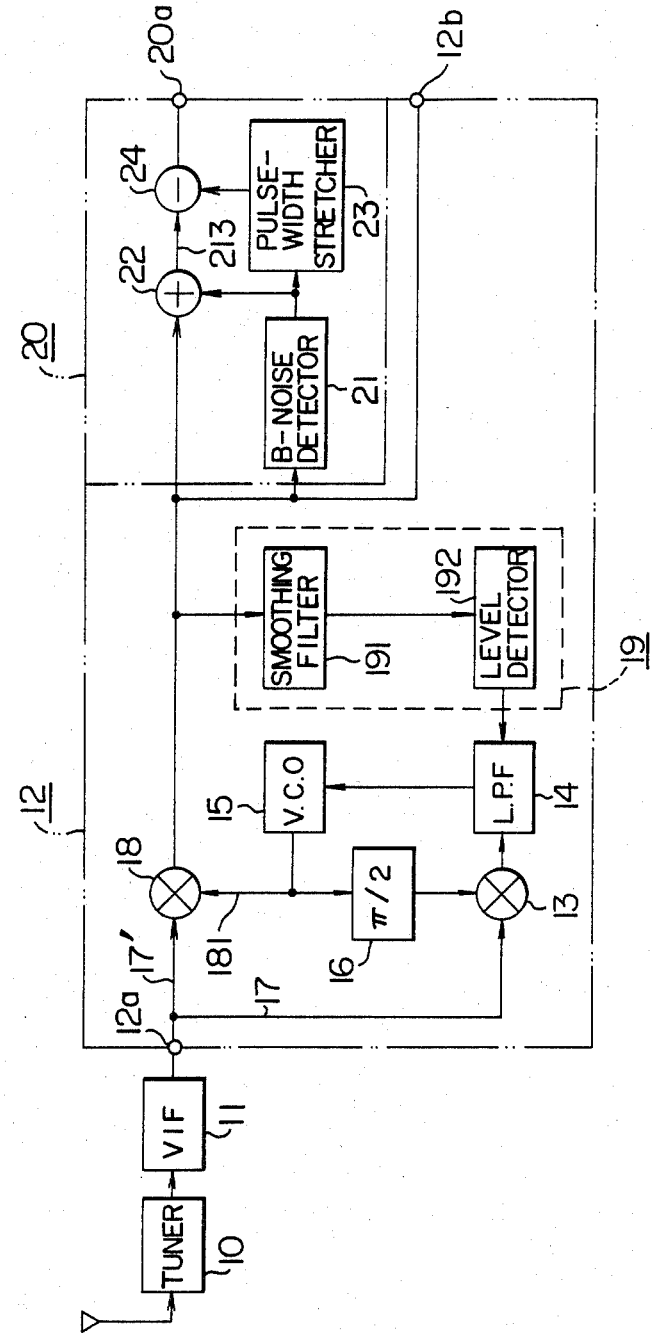
FIG. 1 is a block diagram showing an example of a video detector circuit and a noise cancellation circuit according to the present invention, which are applied to a television receiver.

Referring now to FIG. 1, there is illustrated the basic construction of a synchronous video detector circuit 12 including a PLL (phase-locked loop). In the Figure, a tuner 10 and a video IF filter and amplifier stage 11 (hereinafter simply referred to as a video IF amplifier) form a conventional signal processing system which supplies a video IF signal of a desired channel to a signal input terminal 12a of the video detector circuit 12. The phase-locked loop (PLL) for reproducing a synchronous carrier signal includes a phase comparator 13, a low-pass filter 14 whose time constant is selectable or changed over between at least two values, a voltage-controlled oscillator circuit 15 and a $\pi/2$ (rad) phase shifter 16. A lead wire 17 couples the signal output terminal of the IF amplifier 11 to a signal input terminal of the phase comparator 13 by such untuned coupling means as direct-current coupling means. Also, a video detector 18 has its signal input terminal coupled through a lead wire 17' to the IF amplifier 11 by a similar untuned coupling means as used for the phase comparator 13 and thus the same video IF signal is applied to each of two multipliers respectively forming the video detector 18 and the phase comparator 13. Even if the video IF signal differs from a reference frequency, that is, the local oscillator of the receiver is detuned intentionally or the oscillation frequency is changed by a change in the environmental condition, e.g., the ambient temperature or the supply voltage, no relative phase difference occurs between the two input video IF signals respectively applied to the video detector 18 and the phase comparator 13. As a result, the synchronous carrier reproduced and delivered onto a lead wire 181 by the phase-locked loop 13-15 has a relative phase difference of substantially zero or $\pi$ (rad) with respect to the video IF signal, and the video detector 18 can maintain a given detected phase.

In the PLL synchronous video detector circuit 12 of this invention in which the signal input terminal of the phase comparator 13 is coupled to the signal output terminal of the IF amplifier 11 through the untuned coupling means, when the phase-locked loop is in a phase-locked mode of operation or a synchronous condition, the time constant of the low-pass filter 14 of the loop is set to a value which is about 3 or 4 times the conventional time constant, that is, its signal pass bandwidth is set to a smaller value with a cutoff frequency of about 20 Hz.

Thus, there is the effect of satisfactorily removing the low frequency components of an error signal voltage generated at the output terminal of the phase comparator 13 due to the asymmetrical spectrum of the video IF signal in proximity to the carrier thereof, which video IF signal is produced at the output of the IF amplifier 11 by the conventional frequency selecting circuit or element included in the signal processing circuit for receiving and detecting the television signal transmitted by the vestigial sideband transmission system. This means that the vertical scanning frequency (field frequency) component is also removed during the phase-locked mode of the loop and thus good results will also be obtained in a case where the video detector 18 is operated as a 4.5-MHz intercarrier sound signal detector.

The output signal from the video detector 18 is supplied to a phase-locked mode detector 19 for detecting the phase-locked mode of the phase-locked loop 13-16, and is further supplied to a signal output terminal 12b and a noise cancellation circuit 20. The phase-locked mode detector 19 includes a smoothing filter 191 in the form of an integrator and a level detector 192. Since the video detector 18 is designed to generate at its output terminal a video signal when the phase-locked loop is in the phase-locked mode and to generate a product signal component of its two inputs, i.e., the video IF signal and the output signal of the voltage-controlled oscillator 15 when the loop is in the non-phase-locked mode, the video signal or the product signal component is converted to a dc signal voltage by the smoothing filter 191. The level detector 192 compares the output voltage of the smoothing filter 191 with a reference dc voltage. The low-pass filter 14 is responsive to the output signal of the phase-locked mode detector 19 to effect a selection or change-over between the two values for its time constant and the time constant is set such that its cutoff frequency becomes about 20 Hz when the phase-locked loop is in the phase-locked mode as mentioned previously. Conversely, when the phase-locked loop is in the non-phase-locked mode, the phase-locked mode detector 19 effects the selection or changeover of the time constant for the low-pass filter 14 in such a manner that the time constant is set to the lower value, that is, the cutoff frequency is substantially raised and the cutoff frequency is selected suitably such that the lock range of the phase-locked loop is increased and stable phase locking is ensured despite any deviation of the video IF frequency.

Figure 5A:
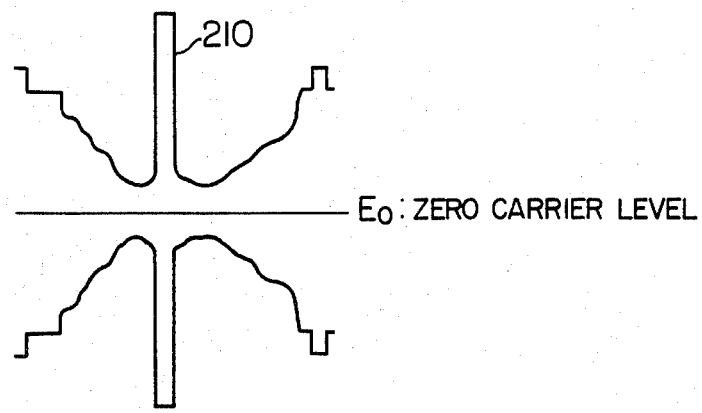
FIGS. 5a and 5b are signal waveform diagrams usefull for explaining the operation of the pulse noise cancellation circuit.

The pulse noise components superimposed on the output signal supplied from the video detector 18 to the noise cancellation circuit 20 involve black noise and white noise in substantially symmetrical form differing from those of the conventional envelope detector. The reason for is that the pulse noise components included in the received RF signal are frequency converted and amplified in the same manner as the signal components and the supplied to the video detector 18. However, since the pulse noise components in the received RF signal are not in a fixed phase relationship with respect to the synchronous carrier which appears on the lead wire 181 irrespective of the phase-locked and non-phase-locked modes of the phase-locked loop, the noise components are converted to noise frequencies of the baseband by the video detector 18. In the present invention, the video signal generated at the output terminal of the video detector 18 is supplied to a black noise detector 21. The black noise detector 21 is responsive only to those noise pulses which are further in the black direction than the synchronous peak value level $E_1$ shown in FIG. 5b to generate a positive polarity signal at its output terminal, that is, a positive pulse is generated in response to the arrival of the noise pulses. Shown in FIG. 5a is the signal waveform at the signal input terminal 12a. This noise pulse corresponds to the black noise pulse shown at 212 in FIG. 5b and ordinary pulse-like noise caused by for example a dryer, extends one H to several Hs (H represents the horizontal scanning time) although shown only for one period in the Figure. In order that the black noise detector 21 may respond accurately to noise pulses which are further in the black direction than the synchronous peak value level $E_1$, it is desirable that the video detector 18 is coupled to the black noise detector 21 by direct-current coupling and this is effective in that if the incoming input signal is weak, any thermal noise component produced, for example, in the input stage of the receiver is kept remote from the noise detection level and thus the black noise detector 21 responds only to the pulse-like noise components. Also, the conventional techniques, such as, the provision of a low-pass filter at the input stage of the black noise detector 21 to make it responsive to given frequency components may also be used effectively when embodying the present invencion. An adder 22 performs the operation of noise cancellation by adding the output noise pulses of the black noise detector 21 which are reversed in polarity with respect to the black noise pulses in the output video signal from the video detector 18. Thus, as shown at 211 in FIG. 5b, only the white noise pulse is superimposed on the video signal appearing on a lead wire 213. In accordance with the invention, a cancellation signal for this white noise includes the output noise pulse of the black noise detector 21 which is stretched in duration. A pulse-width stretcher 23 lengthens the duration of the output noise pulse from the black noise detector 21 by several to several tens μsec. The spurious due to noise usually concentrates at around 2 MHz in the baseband and the cancellation of noise pulses having the greatest disturbing effect only requires that the pulse duration stretching time of the pulse-width stretcher 23 is set to about 0.5 to 1.0 μsec. However, in order to cancel the whiter-than-white noise pulse group generated from the synchronous video detector which is quite different from the conventional envelope detector, the pulse duration must be stretched by about 20 to 30 μsec. A subtractor 24 subtracts and removes the white noise pulse superimposed on the video signal by means of the output noise pulse of the pulse-width stretcher 23 and the video signal having the less-blacker-than-black noise and the whiter-than-white noise removed is delivered to a signal output terminal 20a. Of course, the arrangement of the adder 22 and the subtracter 24 may be reversed and also their operating mechanisms may be suitably selected depending on the polarities of the two input signals.

By virtue of the above-described construction, the following practical advantages which are different from the conventional noise cancellation circuit can be obtained. Namely, since the white noise cancellation signal contains the output pulse of the black noise detector 21, there is no fear of causing any erroneous white noise cancellation action due to the occurrence of any thermal noise component when the incoming input signal is weak. In other words, no undesired black speck is produced in the reproduced picture and serious deterioration of the picture quality is prevented. By virtue of this advantage, if the higher frequency components of the detected video signal are intensified due to changes in the receiving conditions, e.g., changes in the antenna or variations in the frequency of the local oscillator of the receiver and also where a reflected signal (ghost) occurs in the RF signal transmission system, the automatic gain control system of the receiver maintains the dc level of the synchronous peak value at the fixed value and the black noise detector is not responsive to the signals other than noise pulses thereby preventing the occurrence of undesired black specks as in the case of thermal noise. A second advantage is that in accoreance with the invention the stretched time of the pulse-width stretcher is preset such that instead of including only the noise pulse for one period, a greater number of the noise pulses in the noise pulse group are included. As a result, substantially a single cancellation pulse is obtained for the white noise pulse group in the video signal extending over a plurality of periods and this has the extremely practical effect of greatly improving the white noise cancellation effect and preventing the production of interference in the picture due to the white noise.

Figure 2:
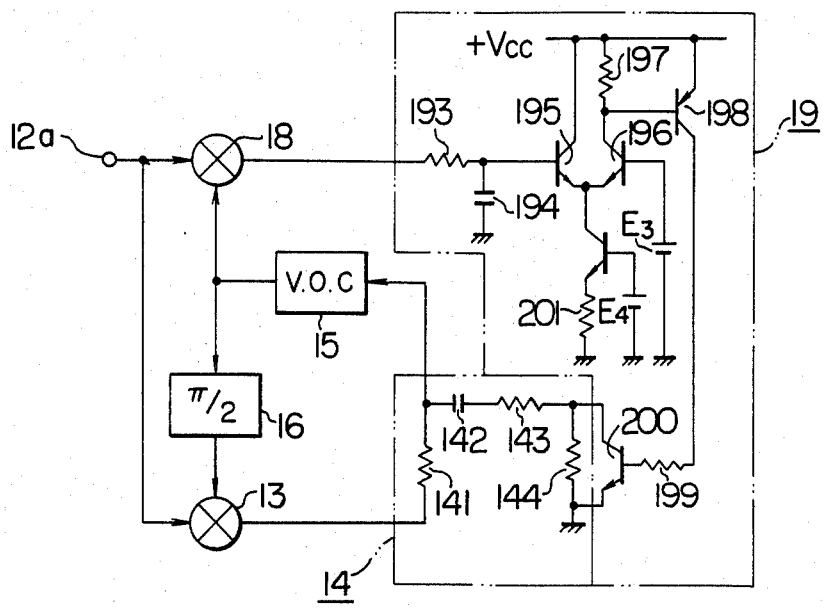
FIG. 2 is a circuit diagram of the video detector circuit in FIG. 1 showing a detailed-construction of a phase-locked mode detector for controlling the PLL and showing a low-pass filter (LPF) of the PLL which is controlled by the phase-locked mode detector.

FIG. 2 illustrates a detailed construction of the phase-locked mode detector 19 and the low-pass filter 14 of the PLL whose time constant can be changedover or selected from the different values.

The phase-locked mode detector 19 includes the smoothing filter 191 including a resistor 193 and a capacitor 194 and the level detector 192 including transistors 195 and 196, and a reference voltage is applied to the base electrode of the transistor 196 from a power source $E_3$. A voltage drop is developed across a load resistor 197 only when the phase-locked loop is in the phase-locked mode, so that a transistor 198 is turned on and a time constant change-over transistor 200 for the low-pass filter 14 is turned on through a current limiting resistor 199. The low-pass filter 14 of the phase-locked loop includes a conventional lag-lead type filter including a resistor 141 for receiving the output signal of the phase comparator 13, a capacitor 142 and resistors 143 and 144 and it has dual response characteristics. In the phase-locked mode of the phase-locked loop, the resistor 144 is substantially short-circuited by the transistor 200 so that the cutoff frequency of the low-pass filter 14 is set to about 20 Hz and the values of the resistors 141 and 143 and the capacitor 142 are selected so that in this case the amount of attenuation of the low-pass filter 14 becomes about 50 dB with respect to such high frequency components as the vertical scanning frequency.

While, in embodying the present invention, the values of the resistors 141, 143 and 144 and the capacitor 142 may suitably set by way of example to 15 to 20 kΩ, 40 to 50 Ω, 500 to 600 Ω and 0.4 to 0.5 μF, respectively, the present invention is not intended to be limited to these values.

In the non-phase-locked mode of the phase-locked loop, the transistor 200 is turned off and the resistor 144 is connected in series with the resistor 143. While, in this embodiment, the cutoff frequency of the low-pass filter 14 has about the same value of 20 Hz as in the phase-locked mode, the amount of attenuation of the low-pass filter 14 is set to about 30 dB with respect to the high frequency components of the output signal from the phase comparator 13 and thus the low-pass filter 14 has substantially a wider passband.

The output signal voltage of the low-pass filter 14 or the control signal to the oscillator 15 is generated from the junction point of the resistor 141 and the capacitor 142. The collector-emitter electrode section of the transistor 200 is connected across the resistor 144 which is not biased in terms of direct current and the base-emitter junction and the base-collector junction are each forward biased and saturated by the switching signal supplied via the resistor 199. In this case the dc bias to the collector electrode is produced only by the difference between the two junction voltages and it is as small as about ten to several tens mV in the case of the ordinary transistor. As a result, the on-off operation of the transistor causes no undesired voltage variation of the control signal voltage to the oscillator 15 and thus high-speed change-over of the response speed of the phase-locked loop from one to another is possible. Another advantage of the invention is obtained in cases where the IF amplifier is incorporated, along with the video detector and other signal processing circuits, in the same integrated circuit chip. The signal level at the signal output terminal 12a of the video IF amplifier 11 is 100 μV to several tens mV and thus the gain of the IF amplifier 11 must be about 50 dB. As is well known, the integrated circuit chip is usually a square of several mm and the leads to the terminals of the integrated circuit package are provided by wires. Thus, there is the disadvantage that if the signal output terminal of the IF amplifier 11 is brought to the outside of the chip, a connection must inevitably be provided between the input and output terminals and the stability of the amplifier is deteriorated. In accordance with the invention, the signal output terminal of the IF amplifier 11 is connected to the signal input terminal of the video detector 18 and the phase comparator 13, respectively, by the untuned coupling means and these coupling means can be provided in the conventional integrated circuit chip. As a result, the IF signal frequency components are not produced at the video signal output terminal and other terminals and the amplifier stability can be improved greatly. While this is the advantage due to the invention, the invention is not limited to this construction and it is possible to arrange any circuits other than a tuning-type frequency selecting circuit which tends to cause any phase change with respect to the carrier component of the video IF signal and frequency components close thereto. This also comes within the scope of the invention.

Figure 3:
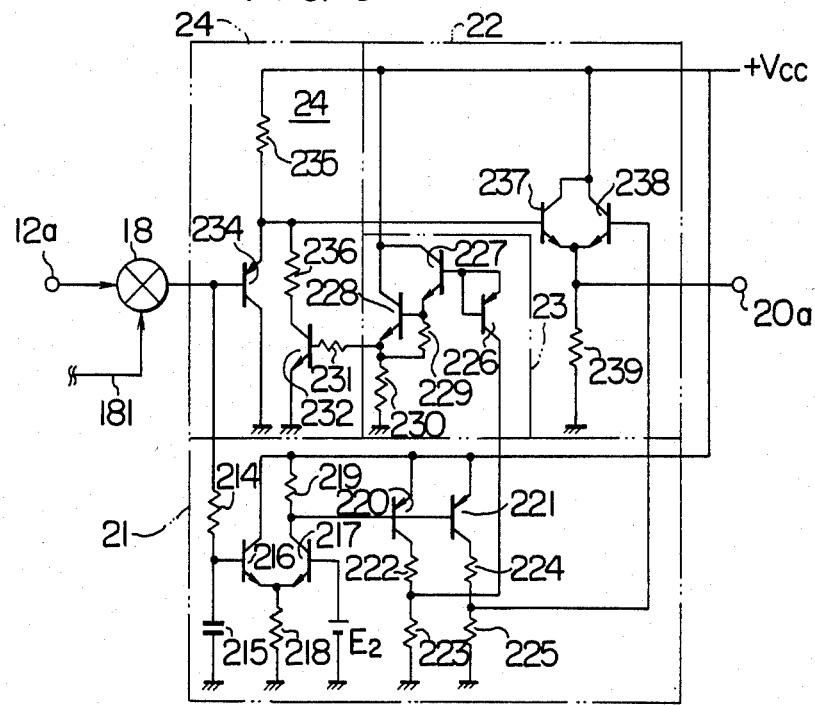
FIG. 3 shows a detailed circuit diagram of a pulse noise cancellation circuit in FIG. 1.
Figure 5B:
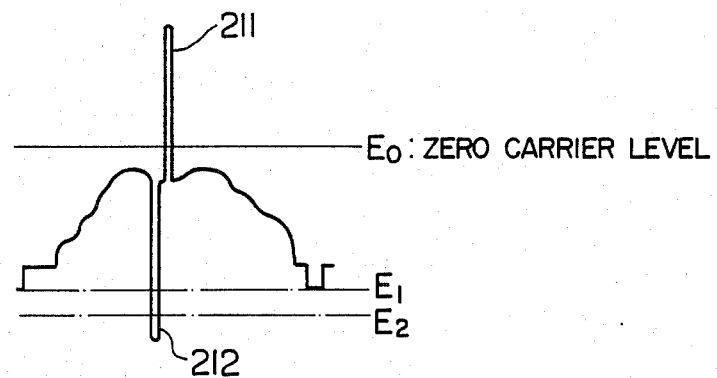

FIG. 3 shows a detailed construction of the noise cancellation circuit 20 suitable for use in the video detector circuit according to the invention. In the Figure, the adder 22 and the subtractor 24 which were described in connection with FIG. 1 are replaced in position with each other. Disposed in the signal input stage of the black noise detector 21 is a low-pass filter icnluding a resistor 214 and a capacitor 215 and the filter removes the high frequency components of the output video signal from the video detector 18. This low-pass filter prevents any undesired response of the noise detector 21 to the intensified high frequency cnmponents of the video signal caused by changes in the receiving condition and the high frequency components of the thermal noise superimposed on the front portion of the synchronous signal as mentioned previously. Transistors 216 and 217 form a level detector in which the detected video signal is applied to the base electrode of the transistor 216 and the base electrode of the other transistor 217 is connected to a reference power source $E_2$ for providing a noise detection level $E_2$ which is further in the black direction than the synchronous peak value $E_1$ as shown in FIG. 5b. As a result, the transistor 217 is turned on only upon arrival of a black noise pulse which exceeds the noise detection level $E_2$ and noise amplifying transistors 220 and 221 having their bases connected to each other are driven to the saturation region. A white noise cancellation pulse is generated from the junction point of resistors 222 and 223 arranged between the collector electrode of the amplifying transistor 220 and the ground and supplied to the pulse-width stretcher 23. The pulse-width stretcher 23 includes emitter follower transistors 227 and 228 connected in Darlington configuration, a diode 226 including a PNP transistor connected forwardly in series with the base electrode of the transistor 227, etc. It is known that a transistor or a diode including a transistor changes its signal response characteristic considerably in dependence on its operating current and it is also known that especially a lateral PNP formed in an integrated circuit is inferior in high frequency performance to the NPN transistor. However, the storage action of the lateral structure PNP transistor is very useful for the pulse width stretching action of this invention and it is possible to stretch the duration of noise pulses by more than 10 μsec by virtue of the series connection to the base electrode of the NPN transistors having an increased current amplification factor (β) through the Darlington connection. The white noise cancellation subtractor 24 is designed so that when the stretched noise pulse is applied, the emitter electrode bias of a PNP transistor 234 is maintained at a given bias level through resistors 235 and 236 and a switching transistor 232. The transistor 234 forming a gate for the noise pulse is designed so that for the noise pulse group included in the detected video signal applied to its base electrode and oscillating in the white and black directions, the instantaneous dc level of the video signal is held at the gray level with respect to only the white noise pulses in the detected video signal which are lower by about 0.7 V than the emitter electrode bias held by the turning on of the transistor 232, thereby performing the white noise cancellation. The black noise cancellation adder 22 includes transistors 237 and 238 whose emitter electrodes are connected to each other and it delivers to its signal output terminal 20a higher one of the video signal including the black noise pulse group and applied to the base electrode of the transistor pair and the output noise pulse from the noise amplifying transistor 221. A black noise cancellation pulse is generated from the junction point of resistors 234 and 235 arranged in series connection with the collector electrode of the transistor 221. As described so far, according to the noise cancellation circuit 20 of this invention, the output pulse of the black noise detector 21 is stretched in duration by a pulse-width stretcher or some suitable means having the equivalent function, e.g., one capable of detecting substantially the envelope response of a noise pulse and the stretched pulse is used as a white noise cancellation pulse and thus there are not only the structural advantage of cancelling both the white and black noise pulses only through the provision of a single noise detector but also a feature of improving at least the white noise cancellation effect in the following manner. When the luminance level of the video signal is low, that is, in the case of the dark picture, if any white noise is produced which is less than the zero carrier level, the noise can be removed satisfactorily and the picture can be changed to the gray level and any increase in the noise contrast due to the white noise can be prevented.

A signal output terminal 12b is provided to generate a 4.5-MHz intercarrier sound signal and the reason for is that if the 4.5-MHz signal is generated from the signal output terminal 20a of the noise cancellation circuit 20, a part of the video signal is held at the given dc level and thus the 4.5-MHz component is similarly subjected to an undesired cancellation action, thus degrading the performance of the sound channel upon the occurrence of pulse noise interference. In accordance with the construction of this invention, there is the advantage in that the 4.5-MHz component is derived from the output signal of the video detector and thus there is less deterioration in the performance of the sound channel upon occurrence of pulse noise interference.

Figure 4:
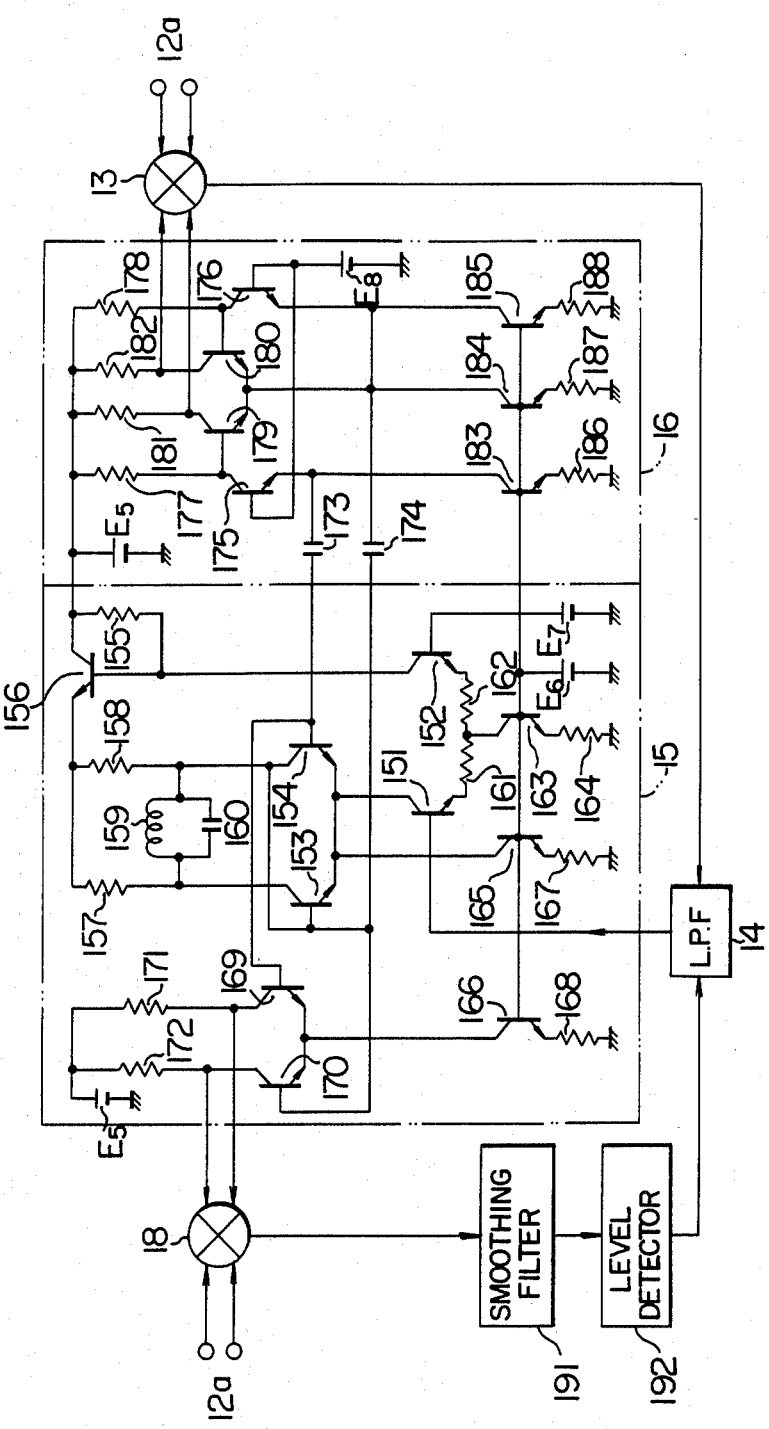
FIG. 4 shows a detailed construction of a voltage-controlled oscillator circuit and a $\pi/2$ (rad) phase shifter in FIG. 1.

FIG. 4 shows by way of example a detailed construction of the voltage-controlled oscillator 15 and the $\pi/2$ (rad) phase shifter 16 suitable for embodying the invention. In the Figure, the collectors of transistor pair 151 and 152 are respectively connected to the interconnected emitter electrodes of oscillatory transistors 153 and 154 and a dc bias $E_5$ through a load resistor 155. The collector bias of the transistor 152 is supplied to the collector electrodes of the transistors 153 and 154 through a transistor 156 and bias resistors 157 and 158. The collector bias currents of the oscillatory transistors 153 and 154 respectively develop a voltage drop across the resistors 157 and 158 and the voltage drops vary with a variation in the current through the transistor 151. When the current flow through the transistor 151 increase, the voltage drops across the resistors 157 and 158 are also increased and the current flow through the transistor 152 is decreased only by an amount corresponding to the current increase. As a result, the voltage drop across the resistor 155 varies in the opposite direction to the voltage drop across the resistors 157 and 158, respectively. The current flowing through the transistor 151 is substantially equally divided into the oscillatory transistors 153 and 154 and thus the amount of change of current flow through the resistors 157 and 158, respectively, is about half the amount of change of current flow through the resistor 155.

With the above-described construction of the voltage-controlled oscillator circuit 15, there is a feature that the signal output terminals of the circuit or the dc bias to the collector electrodes of the transistors 153 and 154 can be maintained at a constant value by selecting the resistance values of the resistors 157 and 158 about two times that of the resistor 155.

The transistors 151 and 152 are responsive to the output error voltage of the phase comparator 13 which is supplied through the low-pass filter 14 so as to change the emitter current of the oscillatory transistors 153 and 154, respectively. The emitter electrodes of the transistors 151 and 152 are respectively connected through resistors 161 and 162 to the collector electrode of a transistor 163 forming a constant current source and a dc bias source $E_7$ is connected to the base electrode of the transistor 152. As a result, the transistors 151 and 152 receive the output error voltage of the phase comparator 13 and subject it to substantially linear voltage-to-current conversion. The sensitivity of this conversion characteristic can be set to a desired value by suitably selecting the resistance values of the resistors 161 and 162. A differential amplifier including transistors 169 and 170 and resistors 171 and 172 amplifiers the synchronous carrier generated at the opposite ends of a parallel resonant circuit which consists of a coil 159 and a capacitor 160, and supplies the same in balanced form to the video detector 18.

The $\pi/2$ (rad) phase shifter 16 includes capacitors 173 and 174 each having one end thereof connected to one end of the parallel resonant circuit, common base amplifying transistors 175 and 176 respectively connected to the other end of the capacitors 173 and 174 and load resistors 177 and 178. The capacitance values of the capacitors 173 and 174 are selected such that their reactances become higher than the common base input resistances or input impedances of the transistors 175 and 176 in the operating frequency band of the oscillator 15. As a result, the phase of the operating voltages or currents of the transistors 175 and 176 leads by $\pi/2$ (rad) the phase of the oscillation signal voltage produced at the opposite ends of the parallel resonant circuit and the phase of the signal voltage produced at the collector electrode of the transistors 175 and 176, respectively, is also advanced by $\pi/2$ (rad). A differential amplifier including transistors 179 and 180 and resistors 181 and 182 amplifiers the synchronous carriers produced at the collector electrodes of the transistors 175 and 176 and shifted in phase by $\pi/2$ (rad) and supply the same in balanced form to the phase comparator 13.

The above-described construction of the voltage-controlled oscillator 15 and the $\pi/2$ phase shifter 16 is extremely well suited and has practical advantages especially for their incorporation in an integrated circuit singly or in combination with any other high-gain amplifier.

Firstly, the oscillator including the transistors 153 and 154 is of the perfect balanced type in terms of alternating current and the oscillation signal voltages produced at the opposite ends of the parallel resonant circuit can be balanced. Thus, there is the advantage in that if the circuit is incorporated in the same chip along with a high-gain amplifier such as the video IF amplifier, there is less chance of causing mutual interference.

Secondly, since the dc bias voltages at the opposite ends of the parallel resonant circuit are not varied by the oscillation frequency voltage control action, even if the capacitors forming the $\pi/2$ (rad) phase shifter 16 are incorporated in the integrated circuit in the form of the conventional PN junction capacitors, their reverse bias voltages are stable and thus no capacitance variation is caused, thereby accurately providing a phase shift of $\pi/2$ (rad). Further, this eliminates the need to deliver the oscillation signal voltages inside the integrated circuit to the outside of the integrated circuit chip and thus the first advantage is made more excellent.

From the foregoing description it will be seen that the video detector circuit of this invention has very great industrial merits in that even if the oscillation frequency of the receiver local oscillator is differed from the reference frequency, not only the detection characteristic of the video detector can be maintained satisfactorily but also the circuit is well suited especially for construction in the form of an integrated circuit and so on.

While the invention has been described with reference to several embodiments, the invention is not intended to be limited to the illustrated constructions and many modifications and changes may be made thereto without departing from the scope of the invention. For instance, the $\pi/2$ (rad) phase shifter 16 is not limited to the arrangement of FIG. 1 and it may be arranged between the voltage-controlled oscillator 15 and the video detector 18. Also, the cancellation signal to the adder 22 of the noise cancellation circuit 20 can be supplied from the output of the pulse-width stretcher 23. These modifications and changes all fall within the scope of the invention.

What is claimed is:

1. A synchronous video detector circuit using a phase-locked loop comprising:
    voltage-controlled oscillator means for receiving an intermediate frequency output signal from a video IF amplifier and for generating first and second oscillation output signals having a phase difference of approximately $\pi/2$ (rad) relative to each other;
    first multiplier means for receiving said intermediate frequency output signal amplified to a given amplitude level by said video IF amplifier and said first oscillation output signal;
    second multiplier means for receiving said intermediate frequency output signal amplified to a given amplitude by said video IF amplifier and said second oscillation output signal;
    coupling means of a type substantially untuned for supplying said intermediate frequency output signal of said video IF amplifier to said first and second multiplier means, respectively;
    phase-locked mode detecting means for receiving an output signal component of said first multipler means to detect a presence of a video signal output; and
    low-pass filter means for generating substantially a dc component of an output signal from said second multiplier means as a control signal to said oscillator means, at least a time constant of said low-pass filter means having a value which is selectably changeable with respect to a plurality of values, whereby said time constant of said low-pass filter means is increased in value to provide a narrow band characteristic which attenuates a vertical scanning frequency component when said phase-locked mode detecting means detects that a phase-locked loop including said voltage-controlled oscillator means, said second multiplier means and said low-pass filter means is in a phase-locked mode of operation and said time constant is decreased in value to provide a wider band characteristic than said narrow band characteristic when said phase-locked loop is in any other mode than said phase-locked mode, said voltage-controlled oscillator means including a voltage controlled oscillator circuit comprising a plurality of amplifying means, a load circuit connected between given output electrodes of said amplifying means, feedback means for feeding signal components generated at output terminals of said load circuit back to signal input electrodes of said amplifying means to apply positive feedback thereto, variable current source circuit means having a voltage-controlled input terminal to vary a bias current to said amplifying means, variable voltage source circuit means for detecting a current change in said variable current source circuit means and converting said current change into a voltage change to generate an output in a same direction as said current change, and bias means for supplying an output voltage of said variable voltage source circuit means to said amplifying means to thereby maintain dc bias levels at the output electrodes of said amplifying means at a substantially constant value.

2. A synchronous video detector circuit according to claim 1, wherein said first multiplier means receives a composite signal comprising a video IF signal and a sound IF signal, and wherein an intercarrier sound signal is obtained from an output signal of said first multiplier means.

3. A synchronous video detector circuit according to claim 1, wherein said load circuit comprises a parallel resonant circuit load comprising at least an inductance element for setting a free-running oscillation frequency, and wherein said bias means comprises a pair of bias resistors each having one end thereof connected to one end of said load and another end thereof connected to an output terminal of said variable voltage source circuit means.

4. A synchronous video detector circuit according to claim 1, wherein said low-pass filter means comprises at least a capacitor, a first resistor and a second resistor connected in series between a signal output terminal of said low-pass filter means and a ground potential or a given reference potential, and wherein said second resistor is disposed to be short-circuited thereacross by semiconductor switching means.

5. A synchronous video detector circuit according to claim 4, wherein said semiconductor switching means comprises a transistor.

6. A synchronous video detector circuit according to claim 1, wherein said variable current source circuit means comprises a transistor pair having one base electrode as a voltage-controlled terminal and emitter electrodes connected to each other, one collector of said transistor pair being connected so as to vary a bias current to said amplifying means and another collector of said transistor pair being connected to a constant reference voltage source through a resistor with a dc bias at a junction point thereof being outputted through a buffer transistor.

7. A synchronous video detector circuit according to claim 6, wherein said emitter electrodes are connected to each other directly.

8. A synchronous video detector circuit according to claim 6, wherein said emitter electrodes are connected to each other through resister means.

9. A synchronous video detector circuit using a phase-locked loop comprising:
    voltage-controlled oscillator means for receiving an intermediate frequency output signal from a video IF amplifier and for generating first and second oscillation output signals having a phase difference of approximately $\pi/2$ (rad) relative to each other;
    first multiplier means for receiving said intermediate frequency output signal amplified to a given amplitude level by said video IF amplifier and said first oscillation output signal;
    second multiplier means for receiving said intermediate frequency output signal amplified to a given amplitude by said video IF amplifier and said second oscillation output signal;
    coupling means of a type substantially untuned for supplying said intermediate frequency output signal of said video IF amplifier to said first and second multiplier means, respectively;
    phase-locked mode detecting means for receiving an output signal component of said first multiplier means to detect a presence of a video signal output;
    low-pass filter means for generating substantially a dc component of an output signal from said second multiplier means as a control signal to said oscillator means, at least a time constant of said low-pass filter means having a value which is selectably changeable with respect to a plurality of values, whereby said time constant of said low-pass filter means is increased in value to provide a narrow band characteristic which satisfactorily attenuates a vertical scanning frequency component when said phase-locked mode detecting means detects that a phase-locked loop including said voltage-controlled oscillator means, said second multiplier means and said low-pass filter means is in a phase-locked mode of operation and said time constant is decreased in value to provide a wider band characteristic than said narrow band characteristic when said phase-locked loop is in any other mode than said phase-locked mode;

noise cancellation means comprising a black noise detector for detecting black noise components in an output video signal from said first multiplier means; and a pulse-width stretcher for increasing a duration of an output noise pulse from said black noise detector, whereby at least white noise in said video siganl is removed by said output noise pulse from said pulse-width stretcher.

10. A synchronous video detector circuit according to claim 9, wherein both black noise and white noise in said video signal are removed by said output noise pulse from said pulse-width stretcher.

11. A synchronous video detector circuit according to claim 9, wherein said first multiplier means receives a composite signal comprising a video IF signal and a sound IF signal, and wherein an intercarrier sound signal is obtained from an output signal of said first multiplier means.

12. A synchronous video detector circuit according to claim 9, wherein said pulse-width stretcher comprises at least a first transistor of emitter follower configuration, and a second transistor connected as a diode in series with a base electrode of said first transistor to receive a base current thereof as a forward current.

13. A synchronous video detector circuit according to claim 12, wherein said black noise detector and said pulse-width stretcher are formed in a single integrated circuit chip, and wherein said second transistor comprises a lateral PNP transistor.

14. A synchronous video detector circuit according to claim 9, wherein said low-pass filter means comprises at least a capacitor, a first resistor and a second resistor connected in series between a signal output terminal of said low-pass filter means and a ground potential or a given reference potential, and wherein said second resistor is disposed to be short-circuited thereacross by semiconductor switching means.

15. A synchronous video detector circuit according to claim 14, wherein said semiconductor switching means comprises a transistor.

* * * * *